(12) United States Patent
Yun et al.

(10) Patent No.: US 11,194,063 B2
(45) Date of Patent: Dec. 7, 2021

(54) X-RAY DETECTOR HAVING DRIVER MICRO INTEGRATED CHIPS PRINTED ON PHOTODIODE LAYER

(71) Applicants: RAYENCE Co., Ltd., Gyeonggi-do (KR); VATECH EWOO Holdings Co., Ltd., Gyeonggi-do (KR); Qpix solutions Inc., Durham, NC (US)

(72) Inventors: Seungman Yun, Durham, NC (US); Ho Seok Lee, Gyeonggi-do (KR); Jin Woong Jeong, Gyeonggi-do (KR)

(73) Assignees: RAYENCE Co., Ltd., Gyeonggi-do (KR); VATECH EWOO Holdings Co., Ltd., Gyeonggi-do (KR); Qpix solutions Inc., Durham, NC (US)

( * ) Notice: Subject to any disclaimer, the term of this patent is extended or adjusted under 35 U.S.C. 154(b) by 0 days.

(21) Appl. No.: 16/731,007

(22) Filed: Dec. 30, 2019

(65) Prior Publication Data
US 2021/0199817 A1 Jul. 1, 2021

(51) Int. Cl.
*G01T 1/20* (2006.01)
*G01T 1/208* (2006.01)
*B41F 16/00* (2006.01)
*H01L 27/146* (2006.01)

(52) U.S. Cl.
CPC .............. *G01T 1/208* (2013.01); *B41F 16/00* (2013.01); *G01T 1/2018* (2013.01); *H01L 27/1469* (2013.01); *H01L 27/14661* (2013.01); *H01L 27/14663* (2013.01); *H01L 27/14689* (2013.01)

(58) Field of Classification Search
CPC . G01T 1/208; G01T 1/2018; H01L 27/14689; H01L 27/14663; H01L 27/14661; H01L 27/1469; B41F 16/00
See application file for complete search history.

(56) References Cited

U.S. PATENT DOCUMENTS

| | | | | |
|---|---|---|---|---|
| 5,464,984 A | * | 11/1995 | Cox | G01T 1/2018 250/370.11 |
| 6,510,195 B1 | * | 1/2003 | Chappo | G01T 1/2018 250/208.1 |
| 7,339,246 B2 | * | 3/2008 | Nascetti | H01L 24/97 257/428 |

(Continued)

OTHER PUBLICATIONS

European Patent Office, European Search Report of corresponding EP Patent Application No. 20166711.0, dated May 15, 2020.

*Primary Examiner* — Kiho Kim
(74) *Attorney, Agent, or Firm* — IP Legal Services, LLC

(57) ABSTRACT

Provided are an X-ray detector including a plurality of pixel driving micro integrated chips separately fabricated from a photodiode layer and printed on the photodiode layer and a method for manufacturing the X-ray detector. The X-ray detector may include a photodiode layer and a driver layer. The photodiode layer may include a plurality of photodiodes and be configured to receive X-ray that have passed through a target object and convert the received X-ray to electric signals. The driver layer may be formed on the photodiode layer and include a plurality of micro driving integrated chips each coupled to two or more photodiodes in the photodiode layer. The plurality of pixel driving integrated chips may be manufactured separately from the photodiode layer and printed on the photodiode layer using a microtransfer printing method.

19 Claims, 9 Drawing Sheets

(56) References Cited

U.S. PATENT DOCUMENTS

| | | |
|---|---|---|
| 9,368,683 B1 | 6/2016 | Meitl et al. |
| 2010/0116996 A1* | 5/2010 | Poorter ................ G01T 1/2018 250/368 |
| 2011/0121189 A1* | 5/2011 | Okada ..................... H04N 5/32 250/370.08 |
| 2012/0097857 A1* | 4/2012 | Hayatsu ............ H01L 27/14618 250/366 |
| 2014/0185765 A1* | 7/2014 | Kang ................... G01T 1/2985 378/62 |
| 2014/0270057 A1* | 9/2014 | Bartolome ........... G01N 23/046 378/19 |
| 2015/0263052 A1 | 9/2015 | Yamazaki et al. |
| 2016/0099274 A1 | 4/2016 | Vora |
| 2018/0001614 A1* | 1/2018 | Bowers et al. ..... H01L 21/3065 |
| 2019/0051552 A1* | 2/2019 | Bower ................ H01L 33/0093 |

* cited by examiner

X-RAY DETECTOR HAVING DRIVER MICRO INTEGRATED CHIPS PRINTED ON PHOTODIODE LAYER

BACKGROUND

The present disclosure relates to an X-ray detector and a method for manufacturing the same using a micro-transfer printing technique. More particularly, the present disclosure relates to an X-ray detector including a plurality of pixel driving integrated chips printed on a plurality of photodiodes and each of the pixel driving integrated chips simultaneously or sequentially controlling multiple pixels.

In medical or industrial radiography, a digital X-ray detector has been widely used. Such a digital X-ray detector may be commonly referred to as an X-ray detector or an image detector. Further, such a digital detector may be classified into an indirect conversion type X-ray detector and a direct conversion type X-ray detector. The indirect conversion type X-ray detector i) converts X-rays (e.g., X-ray photons) into visible light (e.g., light photons) using a scintillator and ii) converts the visible light into an electric signal. The direct conversion digital detector directly converts X-rays into an electric signal using a photoconductive layer.

As described, an X-ray detector detects X-ray signals that are radiated from an X-ray source, have passed through a target object, and reached to the X-ray detector. The X-ray detector converts the detected X-ray signals into electric signals. Such an X-ray detector includes a pixel array panel including a plurality of pixels. Each pixel includes a light receiving element (e.g., photoconductor or photodiode) and a driving element for driving the light receiving element of each pixel.

Such an X-ray detector (e.g., photodiode) may be manufactured using a thin-film transistor (TFT) process or a complementary metal-oxide-semiconductor (CMOS) process. The TFT process is advantageous for manufacturing a large surface X-ray detector with a low manufacture unit price. The CMOS process is advantageous for manufacturing a high image quality X-ray detector generating comparably low radiation dose and having a dynamic imaging capability. However, the TFT process may have limitations for manufacturing a high image quality X-ray detector because it is difficult to form metal lines in a nanometer level due to a high temperature chamber and an amorphous process. The CMOS process may have limitations for manufacturing a large surface X-ray detector because of a silicon wafer size.

Therefore, there is a demand for a mass production method for manufacturing a large surface X-ray detector having a high image quality and generating a comparably low radiation dose.

SUMMARY

In accordance with an aspect of the present embodiment, an X-ray detector may include a plurality of pixel driving micro integrated chips (ICs) printed on a top of a photodiode layer, using a micro-transfer printing technology.

In accordance with another aspect of the present embodiment, an X-ray detector may include a plurality of pixel driving micro integrated chips on photodiodes, each to form a three dimensional structure with an inter-layer dielectric (ILD) metal contact and a bottom photodiode layer in order to maximize a fill factor (e.g., an area ratio of a photodiode area in a unit pixel), to improve an absorption ratio of X-ray (e.g., X-ray photons), and to minimize an X-ray exposure dose.

In accordance with still another aspect of the present embodiment, an X-ray detector may be a back side illumination (BSI) type detector and include a pixel driving micro IC printed on a top of a photodiode layer, using a micro-transfer printing technology.

In accordance with further another aspect of the present embodiment, an X-ray detector may include a plurality of pixel driving micro ICs which is formed on a source silicon wafer, transferred onto a stamp, and printed on a photodiode layer as a target panel through the stamp.

In accordance with yet another aspect of the present embodiment, an X-ray detector may include i) a photodiode layer fabricated through a thin film transistor (TFT) process and ii) a plurality of pixel driving micro ICs fabricated separately from the photodiode layer, fabricated on a source silicon wafer through a complementary metal oxide semiconductor (CMOS) process, and printed on the photodiode layer.

In accordance with further yet another aspect of the present embodiment, an X-ray detector may have a photodiode layer including i) a plurality of photodiodes formed as a continuous layer in order to minimize a unit manufacture price or ii) a plurality of photodiodes formed in an Island array structure in order to minimize the crosstalk of electric signals generated from adjacent pixels.

In accordance with further still another aspect of the present embodiment, an X-ray detector may have a comparatively light weight and an improved durability by removing a passivation layer (e.g., glass substrate) of a panel substrate using a laser lift off technique.

In accordance with one embodiment, an X-ray detector may be provided for including a photodiode layer including a plurality of photodiodes and configured to receive X-ray (e.g., X-ray photons) that have passed through a target object and convert the received X-ray (e.g., X-ray photons) to electric signals, and a driver layer formed on the photodiode layer and including a plurality of micro driving integrated chips each coupled to two or more photodiodes in the photodiode layer. The plurality of pixel driving integrated chips may be manufactured separately from the photodiode layer and printed on the photodiode layer using a micro-transfer printing method.

Each one of the plurality of pixel driving integrated chips may be coupled to two or more photodiodes in the photodiode layer and controls the coupled photodiodes.

Each one of the plurality of pixel driving integrated chips may be coupled to four photodiodes.

Each one of the plurality of pixel driving integrated chips may include a timing generator configured to generate a timing signal to sequentially control the coupled photodiodes, a plurality of switches each coupled to corresponding photodiode, and a pixel driver transistor configured to sequentially turn on the plurality of switches according to the generated timing signal.

The photodiode layer may be manufactured using a thin-film transistor (TFT) process. The plurality of pixel driving integrated chips may be manufactured on a source wafer using a complementary metal-oxide-semiconductor (CMOS) process, transferred onto an elastomer stamp, and printed on the photodiode layer using the elastomer stamp through the micro-transfer printing method.

The X-ray detector may further include a scintillator layer formed on the driver layer as a front side illumination type X-ray detector and configured to convert X-ray photons to visible light photons.

The X-ray detector may further include a scintillator layer formed on the photodiode layer as a back side illumination type X-ray detector and configured to convert X-ray photons to visible light photons.

Each one of the plurality of pixel driving integrated chips may be formed on the photodiode layer to form a three-dimension structure with corresponding metal contacts and a corresponding common bottom layer of a corresponding photodiode.

An adhesive layer made of predetermined resin may be formed on the photodiode layer for printing the plurality of micro driving integrated chips thereon.

The plurality of micro driving integrated chips may be fabricated on a source silicon wafer, the plurality of fabricated micro driving integrated chips may be transferred onto an elastomer stamp, and the plurality of fabricated micro driving integrated chips may be printed on the photodiode layer by stamping the elastomer stamp on the photodiode layer.

In accordance with another embodiment of the present disclosure, a method may be provided for manufacturing an X-ray detector. The method may include forming a photodiode layer on an insulating substrate, for example, glass substrate, wherein the photodiode layer includes a plurality of photodiodes and configured to receive X-ray (e.g., X-ray photons) that have passed through a target object and convert the received X-ray (e.g., X-ray photons) to electric signals, forming a driver layer on the photodiode layer by printing a plurality of micro driving integrated chips on the photodiode layer using a micro-transfer printing method, and forming contact holes through the driver layer and the photodiode layer and forming metal contact layers by filling the contact holes for coupling one micro driving integrated chip to two or more photodiodes in the photodiode layer.

The printing operation may include fabricating the plurality of micro driving integrated chips on a source silicon wafer, transferring the plurality of fabricated micro driving integrated chips onto an elastomer stamp, and printing the plurality of fabricated micro driving integrated chips on the photodiode layer by stamping the elastomer stamp on the photodiode layer.

The fabricating of the plurality of micro driving integrated chips may include performing a complementary metal oxide semiconductor (CMOS) process to fabricate the plurality of micro driving integrated chips on the source wafer, and the forming of the photodiode layer may include performing a thin-film transistor (TFT) process to fabricate the photodiode layer.

The method may further include forming an adhesive layer on the photodiode layer for printing the plurality of micro driving integrated chips on the photodiode layer, wherein the plurality of micro driving integrated chips is transferred onto an elastomer stamp, and the plurality of transferred micro driving integrated chips on the elastomer stamp is printed on the photodiode layer.

The forming of the metal contact layers may include forming the metal contact layers for coupling each one of the plurality of micro driving integrated chips to corresponding four adjacent photodiodes in the photodiode layer, wherein the each one micro driving integrated chip is configured to sequentially or simultaneously control the coupled four adjacent photodiodes.

The method may further include forming a scintillator layer formed on the driver layer as a front side illumination type X-ray detector.

The method may further include removing the insulating substrate, for example, glass substrate of the photodiode layer using a laser lift off technique, flipping the driver layer and the photodiode layer and placed the flipped resultant on an adhesive layer formed on a carrier substrate, and forming a scintillator layer formed on a bottom common electrode layer of the photodiode layer as a back side illumination type X-ray detector.

In the printing a plurality of micro driving integrated chips on the photodiode layer, each one of the plurality of pixel driving integrated chips may be placed to form a three dimensional structure with corresponding metal contacts and a corresponding common bottom layer of a corresponding photodiode.

DETAILED DESCRIPTION OF EMBODIMENTS

Figure 1:
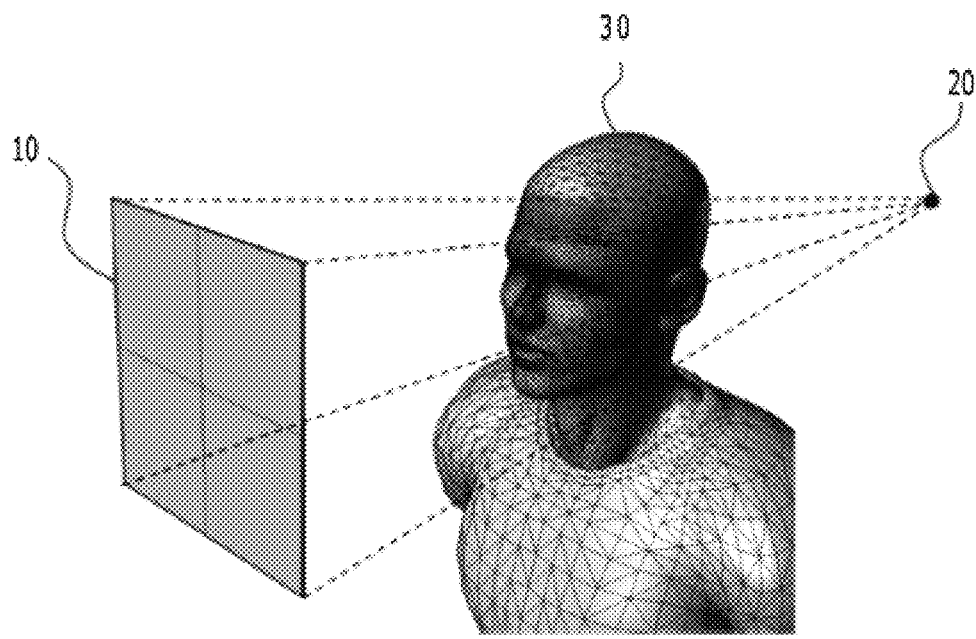
FIG. 1 is a view illustrating an X-ray detector receiving X-rays transmitted form an X-ray source and passed through a target object in accordance with at least one embodiment.

In accordance with at least one embodiment, an X-ray detector may be provided to have a comparatively simple structure that allows to be manufactured in a mass production method while providing a high image quality. In particular, the X-ray detector may include i) a photodiode layer including a plurality of pixels in a form of matrix which is fabricated independently from other elements, such as pixel driving micro integrated chips, and ii) a plurality of pixel driving micro integrated chips (ICs) that is fabricated separately from the photodiode layer and printed on a top of the photodiode layer, using a micro-transfer printing technology, and each pixel driving micro integrated chip may be coupled to multiple pixels (e.g., photodiodes) to simultaneously and sequentially control the coupled multiple pixels. The photodiode layer may be fabricated using a thin-film transistor (TFT) process which is advantageous in manufacturing a large surface detector at a low unit manufacturing price, and the pixel driving micro integrated chip may be fabricated using a complementary metal-oxide-semiconductor (CMOS) process which is advantages in manufacturing a detector with high precision and high quality. In particular, the pixel driving micro integrated chips may be formed on a source silicon wafer, transferred on an elastomer stamp, and printed on the photodiode layer using the elastomer stamp. Accordingly, the X-ray detector according to an embodiment may be manufactured through a mass production method while maintaining the high image quality. Furthermore, since one pixel driving micro integrated chip controls multiple pixels, the X-ray detector may require comparatively less metal lines (e.g., data lines and gate lines) and fewer fabricating steps.

In accordance with at least one embodiment, the X-ray detector may be a front side illumination type detector. In this case, i) a photodiode layer including a plurality of photodiodes may be fabricated, ii) the plurality of pixel driving micro integrated chips may be printed on the photodiode layer, and iii) a scintillator layer may be formed on the top of the plurality of pixel driving micro integrated chips printed on the photodiode layer. Each pixel driving micro integrated chip does not block a corresponding pixel. Instead, each pixel droving micro integrated chip may form a three-dimensional structure with an inter-layer dielectric (ILD) metal contacts and a bottom photodiode layer. Accordingly, a fill factor of the front-side illumination type X-ray detector may be maximized while requiring comparatively fewer manufacturing steps. Due to such a maximized fill factor, the X-ray detector may have a comparatively high absorption ratio of X-ray photons, thereby minimizing an X-ray exposure dose to a target object (e.g., patient).

In accordance with another embodiment, the X-ray detector may be a back side illumination type detector. In this case, i) a photodiode layer including a plurality of pixels (e.g., photodiodes) may be fabricated on a insulating substrate, for example, glass substrate, ii) the plurality of pixel driving micro integrated chips may be printed on the photodiode layer, iii) the insulating substrate, for example, glass substrate may be removed by a laser lift off technique, iv) the resultant may be flipped and placed on a carrier substrate, and v) a scintillator layer may be formed on the top of the bottom electrode layer. Accordingly, photodiodes in the photodiode layer may receive light protons from the scintillator layer without being blocked by the pixel driving micro IC and metal contacts thereof.

In accordance with yet another embodiment, an X-ray detector may include a photodiode layer (e.g., photodiode layer) that is formed as a continuous layer. Such a structure may allow minimizing a unit manufacturing price.

In accordance with further another embodiment, an X-ray detector may include a photodiode layer includes a plurality of photodiodes in a form of an island array structure. Such a structure of the X-ray detector may minimize the crosstalk of electric signals generated between pixels.

In accordance with still another embodiment, an X-ray detector may have a comparatively light weight by removing a glass layer (e.g., a passivation layer of a panel substrate) using a laser lift off technique. Since the X-ray detector includes no insulating substrate, for example, glass substrate, the X-ray detector may have enhanced durability.

Hereinafter, the X-ray detector and the method for manufacturing the same according to embodiments will be described with reference to the accompanying drawings. For convenience of describing and ease of understanding, an X-ray detector may be representatively denote a detector receiving X-ray (e.g., X-ray photons) passed through a target object and generating electric signals by converting the received X-ray photons. However, the embodiments of the present disclosure are not limited thereto. The X-ray detector may be referred as an imaging detector, an image sensor, a digital detector, and so forth.

FIG. 1 is a view illustrating an X-ray detector receiving X-ray (e.g., X-ray photons) transmitted form an X-ray source and passed through a target object in accordance with at least one embodiment.

Referring to FIG. 1, X-ray detector 10 and X-ray source 20 may be respectively installed and disposed to face each other. X-ray source 20 may generate X-ray (e.g., X-ray photons) and radiate the generated X-ray toward target object 30, such as a patient.

X-ray detector 10 may i) receive X-ray (e.g., X-ray photons) that are generated from X-ray source 20 and passed through target object 30 and ii) convert the received X-ray (e.g., X-ray photons) indirectly or directly to electric signals in accordance with at least one embodiment. X-ray detector 20 may have a rectangular shape in plan, but the shape of X-ray detector 20 is not limited to thereto.

In accordance with at least one embodiment, X-ray detector 10 may be an indirect type X-ray detector that receives X-ray (e.g., X-ray photons) passed through target object 30, converts the X-ray (e.g., X-ray photons) to visible light photons, and converts the visible light photons into the electric signals. Accordingly, X-ray detector 10 may include a scintillator layer for converting X-rays photons into visible light photons. Such a scintillator layer may be made of cesium iodide (CsI), but the embodiments of the present disclosure are not limited thereto. For example, X-ray detector 10 may be a direct type X-ray detector that converts the X-ray (e.g., X-ray photons) directly to electrical signals. In case of the direct type X-ray detector, X-ray detector 10 may exclude the scintillator layer.

In accordance with at least one embodiment, X-ray detector 10 may include a plurality of pixel driving micro integrated chips (ICs) that are separately fabricated from a photodiode layer by using a manufacturing method allowing high precision fabrication different from that for manufacturing a photodiode layer and are printed on a top of a photodiode layer, using a micro-transfer printing technology. Therefore, such a structure of X-ray detector 10 may allow to be manufactured in mass production while maintaining high image quality and generating comparatively less X-ray does in accordance with at least one embodiment.

In X-ray detector 10, each pixel driving micro IC may form a three dimensional structure with an inter-layer dielectric (ILD) metal contact and a bottom photodiode layer in accordance with at least one embodiment. Such a structure of X-ray detector 10 may maximize a fill factor, improve an absorption ratio of X-ray photons, and minimize an X-ray exposure dose of target object 30. Herein, the fill factor denotes an area ratio of a photodiode area in a unit pixel.

In accordance with another embodiment, X-ray detector 10 may be a back side illumination (BSI) type. In case of the back side illumination type X-ray detector, a driver layer including pixel driving micro integrated chips is placed beneath a photodiode layer, and a scintillator layer is formed above a bottom electrode of the photodiode layer. Accordingly, the pixel driving micro integrated chips and metal contact layers do not block light photons to reach the photodiode layer. Such a structure of back side illumination type X-ray detector 10 further improves the fill factor in accordance with another embodiment of the present disclosure.

In accordance with at least one embodiment, X-ray detector 10 may include i) photodiode layer (e.g., photodiode layer) that is made of amorphous silicon (a-Si) or organic photodiode and formed as a continuous layer or arranged in an island array structure. In case of forming in a continuous layer, it may minimize a unit manufacture price. In case of forming in the island array structure, it may minimize crosstalk of electric signals generated between pixels.

In accordance with at least one embodiment, X-ray detector 10 may have a comparatively light weight and enhanced durability by removing a passivation layer and a insulating substrate, for example, glass substrate using a laser lift off technique.

Figure 2:
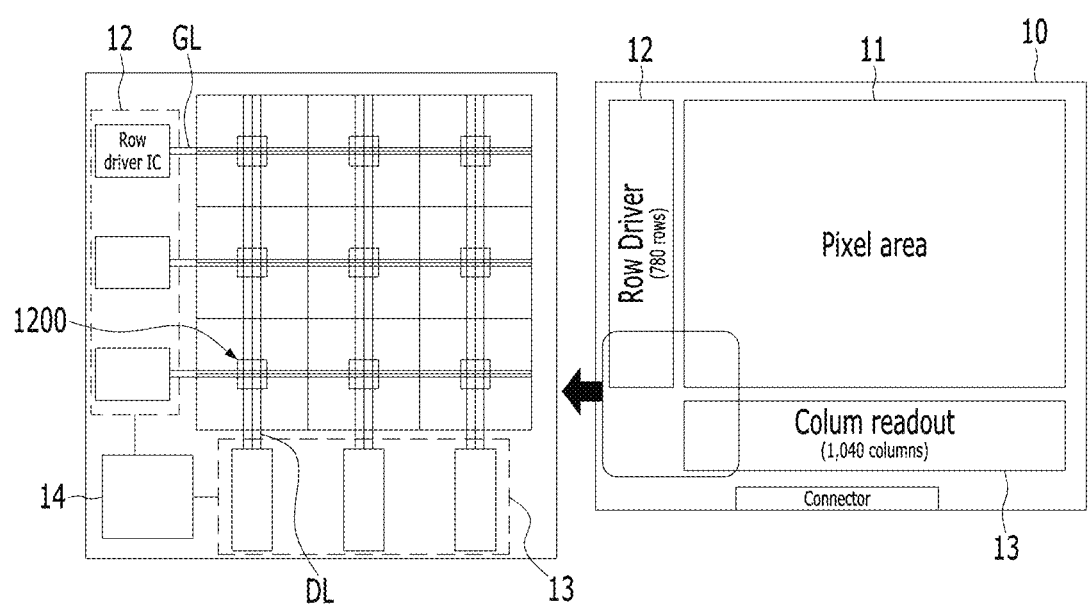
FIG. 2 illustrates an internal structure of an X-ray detector in accordance with at least one embodiment.

Hereinafter, such a structure of X-ray detector 10 will be described in more detail with reference to FIG. 2. FIG. 2 illustrates an internal structure of an X-ray detector in accordance with at least one embodiment.

Referring to FIG. 2, X-ray detector 10 may include pixel area circuit 11, gate driver circuit 12, data driver circuit 13, and control circuit 14 in accordance with at least one embodiment. Pixel area circuit 11 may be a main panel that receives X-ray photons, converts X-ray (e.g., X-ray photons) to visible light photons, and converts light photons to electric signals. That is, pixel area circuit 11 may be an indirect conversion type in accordance with at least one embodiment. However, the embodiments of the present disclosure are not limited thereto. For example, pixel area circuit 11 in another embodiment may be a direct conversion type. In the direct conversion type, pixel area circuit 11 excludes a scintillator layer and converts X-ray (e.g., X-ray photons) directly to electric signals.

Pixel area circuit 11 may include a plurality of pixels P, each serving as a unit photo-electric conversion element, arranged in matrix in accordance with at least one embodiment. Each pixel P may be a unit of a light receiving element (e.g., light conversion element). Each pixel P may include a photodiode that converts the incident light into the electrical signals. Each pixel P may be coupled to gate driver circuit 12 through gate lines GL formed to extend in a row direction and to data driver circuit 13 through data lines DL formed to extend in a column direction.

Typically, each pixel P includes a pixel driving element for controlling a corresponding pixel to read a signal accumulated therein. Unlike the typical art, pixel P does not include a pixel driving element in accordance with at least one embodiment. In accordance with at least one embodiment, pixel area circuit 11 may include a plurality of pixel driving micro integrated chips (ICs) that are separated fabricated from a photodiode layer and printed on the photodiode layer using a micro-transfer printing technology. The micro-transfer printing technology may use an elastomer stamp to print devices (e.g., pixel driving micro integrated chips) on a target panel (e.g., a photodiode layer).

In particular, the plurality of micro driving integrated chips may be fabricated on a source silicon wafer, for example, using a CMOS process, the plurality of fabricated micro driving integrated chips may be transferred onto an elastomer stamp, and the plurality of fabricated micro driving integrated chips may be printed on the photodiode layer by stamping the elastomer stamp on the photodiode layer.

Each of the pixel driving micro integrated chips 1200 may be coupled to four photodiodes and sequentially control the four pixels in accordance with at least one embodiment. However, the embodiments of the present disclosure are not limited thereto. For example, one pixel driving micro integrated chip 1200 may be coupled to two photodiodes, three photodiodes, or five photodiodes in accordance with another embodiment. That is, one pixel driving micro integrated chip 1200 may be coupled to more than two photodiodes. The number of photodiodes coupled to one pixel driving micro integrated chip may depend on various factors influencing manufacturing efficiency or performance properties, such as a circuit design.

Each of pixel driving micro integrated chips 1200 may switch on coupled four photodiodes, sequentially, in response to a signal from gate driver circuit 12, read data from the coupled four photodiodes, and output the read data to data driver circuit 13. Such a pixel driving micro integrated chip 1200 will be described with reference to FIG. 3 in more detail.

Referring to FIG. 2 again, X-ray detector 10 may include gate drive circuit 12, data drive circuit 13, and control circuit 14. Control circuit 14 may generate control signal, transmit the generated control signal to gate driver circuit 12 and data driver circuit 13, and controls the operation of gate drive circuit 12 and data drive circuit 13. Control circuit 140 receives the read out data D from data drive circuit 13 and may deliver the data D on a per-frame basis to an image processing circuit (not shown) outside X-ray detector 10.

Gate driver circuit 12 may control the timing of output of a gate signal according to the gate control signal supplied from control circuit 14. Data driver circuit 13 read outs the data accumulated in the pixels P. The read out data D are delivered to the control circuit 240. The data drive circuit 230 is controlled based on the data control signal supplied from the control circuit 240.

As described, X-ray detector 10 includes a plurality of pixel driving micro integrated chips 1200, each coupled to four photodiodes and controlling the coupled four photodiodes, sequentially. Such a pixel driving micro integrated chip 1200 will be described with reference to FIG. 3 in more detail.

Figure 3:
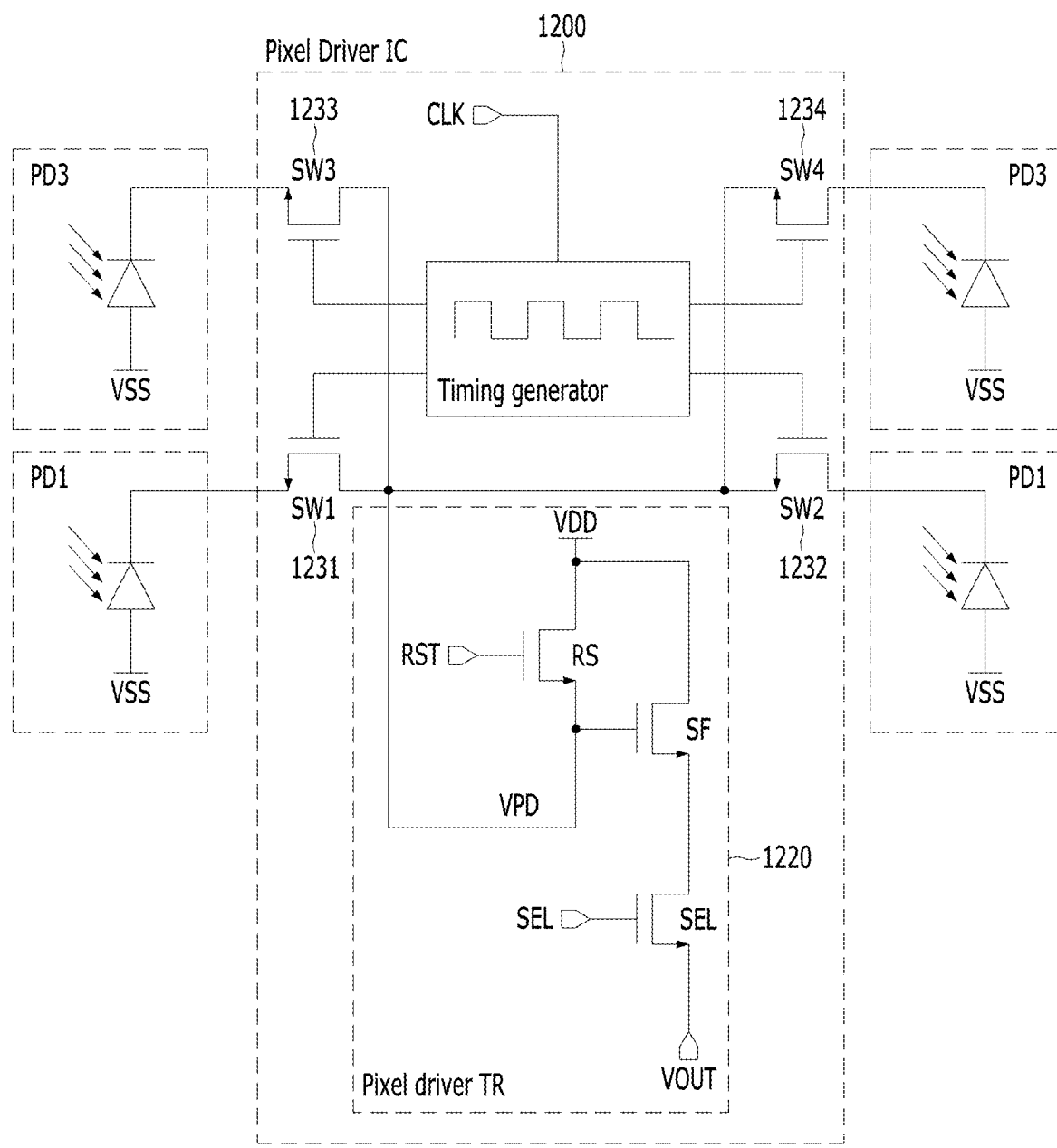
FIG. 3 is a circuit diagram illustrating a pixel driving micro integrated chip in accordance with at least one embodiment.

FIG. 3 is a circuit diagram illustrating a pixel driving micro integrated chip in accordance with at least one embodiment. Referring to FIG. 3, pixel driving micro integrated chip 1200 may be coupled to first photodiode PD1, second photodiode PD2, third photodiode PD3, and four photodiode PD4 and sequentially control four photodiodes PD1, PD2, PD3, and PD4. In particular, pixel driving micro integrated chip 1200 may sequentially turn on corresponding switches of first to four photodiode PD1 to PD4, sequentially read data accumulated in first to four photodiodes PD1 to PD4, and sequentially output read data to data driver circuit 13, in accordance with at least one embodiment.

In order to sequentially control the photodiodes, pixel driving micro integrated chip 1200 may include timing generator 1210, pixel driver transistor (TR) 1220, and four switches 1231 to 1234. For example, pixel driving micro integrated chip 1200 may be electrically coupled to first photodiode PD1 through first switch 1231, electrically coupled to second photodiode PD2 through second switch 1232, electrically coupled to third photodiode PD3 through third switch 1233, and electrically coupled to fourth photodiode PD4 through fourth switch 1234.

Timing generator 1210 may receive a clock signal (CLK), for example, from gate driver circuit 12 and generate a timing signal to sequentially switch first to fourth switches 1231 to 1234. In accordance with at least one embodiment, timing generator 1210 may be implemented with a digital counter or a shift register. In particular, a 2-bit counter may be used to minimize an IC size.

Pixel driver transistor (TR) 1220 may read data from one of photodiodes PD1 to PD4 which is switched on by the timing signal from timing generator 1210 and output the data to data driver circuit 13. Such pixel driver transistor (TR) 1220 may be implemented in a three transistor (3T) structure or a four transistor (4T) structure.

As described, four photodiodes are controlled by one pixel driver micro IC 1200 in accordance with at least on embodiment. Such a structure of X-ray detector 10 minimizes metal lines coupled to pixels and driver circuits. Accordingly, the above-described structure improves a fill factor, simplifies a manufacturing process, and reduces a unit manufacturing price in accordance with at least one embodiment.

Figure 4:
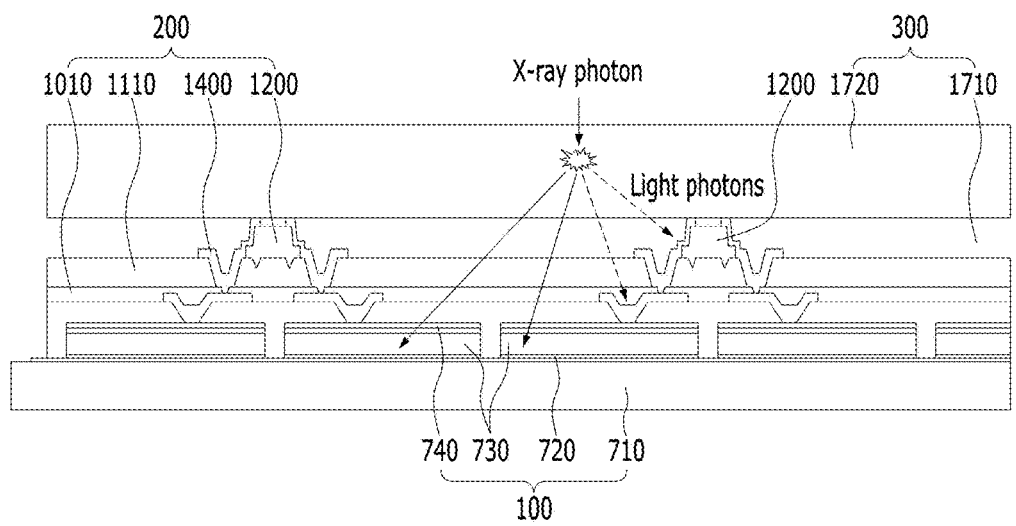
FIG. 4 is a cross sectional view of a predetermined section in a pixel area of an X-ray detector in accordance with one embodiment of the present disclosure.

FIG. 4 is a cross sectional view of a predetermined section in a pixel area of an X-ray detector in accordance with one embodiment of the present disclosure.

For example, FIG. 4 shows a predetermined part of a pixel area of a front side illumination type X-ray detector according to one embodiment. As shown in FIG. 4, the pixel area of the X-ray detector may include three major layers, photodiode layer 100, driver layer 200, and scintillator layer 300.

In accordance with at least one embodiment, photodiode layer 100 may include common electrode 720 formed on insulating substrate 710, a plurality of photodiodes 730 arranged on common electrode 720 in matrix, and top transparent pixel electrode 740. For example, insulating substrate 710 may be a glass substrate.

A plurality of photodiodes 730 may receive visible light photons and convert light photons into an electrical signal. Such photodiode 730 may have a PIN diode structure including a P+ type region (e.g., high-concentration P type), a I type region, and an N type region. For example, the P type photoconductive material may be CdTe.

Such photodiode layer 100 may be manufactured using a TFT process in accordance with at least one embodiment. Accordingly, photodiode layer 100 may be manufactured as a large surface X-ray detector with a comparatively low manufacturing price. Furthermore, such photodiode layer 100 may be manufactured as a continuous layer for a comparatively low manufacturing price. Alternatively, photodiode layer 100 may be formed in an island array structure by patterning the continuous photodiode layer. In this case, such a structure may minimize crosstalk between adjacent photodiodes.

Driver layer 200 may include a plurality of pixel driving ICs 1200 each controlling at least two of photodiodes and metal contacts connecting pixel driving ICs to corresponding photodiodes 730. In an embodiment of the present disclosure, one pixel driving IC 1200 sequentially or simultaneously controls four photodiodes. However, the embodiments of the present disclosure are not limited thereto. The number of photodiodes controlled by one pixel driving IC 1200 may be vary according to various factors related to the X-ray detector.

In particular, a plurality of pixel driving ICs 1200 are manufactured separately from the photodiode layer 100 and printed on photodiode layer 100 using the micro-transfer printing technology after forming contact holes in photodiode layer 100. Then, metal contacts 140 are formed to connect pixel driving ICs 1200 to corresponding photodiodes 730. As described, the plurality of pixel driving ICs 1200 may be manufactured using a CMOS process and printed on photodiode layer 100 using the micro-transfer technology. Accordingly, pixel driving ICs 1200 may be manufactured with high precision (e.g., nanometer level) to have a high image quality.

Scintillator layer 300 may be formed on driver layer 200. Scintillator layer 300 may convert X-rays into visible light. Scintillator layer 300 may have flexible properties. Scintillator layer 300 may be formed of CsI or Gadox (Gd2O2:Tb).

Figure 5:
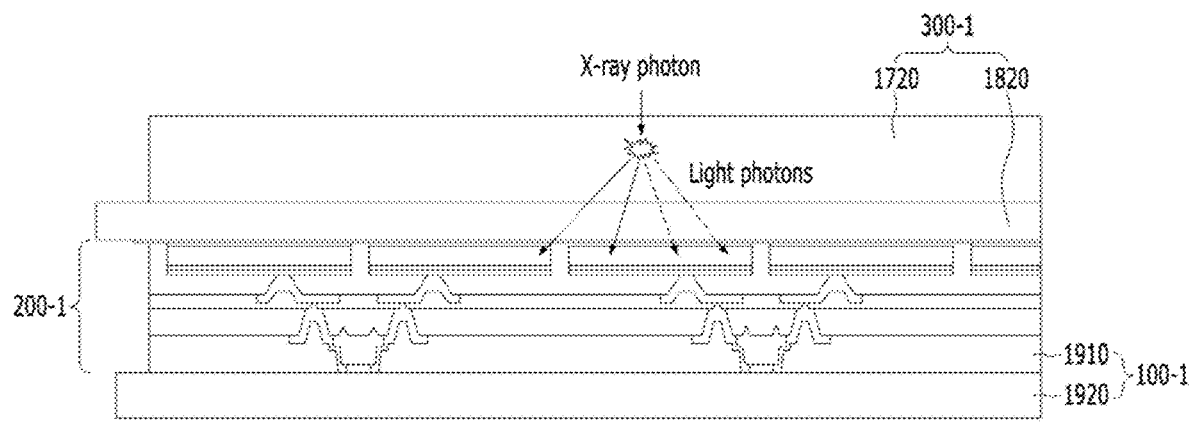
FIG. 5 is a cross sectional view of a predetermined section in a pixel area of an X-ray detector in accordance with another embodiment of the present disclosure.

FIG. 5 is a cross sectional view of a predetermined section in a pixel area of an X-ray detector in accordance with another embodiment of the present disclosure. For example, FIG. 5 shows a predetermined part of a pixel area of a back side (BS) illumination type X-ray detector according to one embodiment. As shown in FIG. 5, the pixel area of the X-ray detector may include driver layer 200-1, photodiode layer 100-1, and scintillator layer 300-1. Each of driver layer 200-1, photodiode layer 100-1, and scintillator layer 300-1 of the BS illumination type X-ray detector may have a structure similar to corresponding layers of the FS illumination type X-ray detector.

As shown in FIG. 5, photodiode layer 100-1 may be presented on driver layer 200-1 in the BS illumination type X-ray detector. That is, driver layer 200-1 and photodiode layer 100-1 of FIG. 5 may be upside down photodiode layer 100 and driver layer 200 of FIG. 4. For example, driver layer 200-1 is formed on photodiode layer 100-1, and the resultant of driver layer 200-1 and photodiode layer 100-1 is flipped in accordance with at least one embodiment. Then, the resultant may be placed on adhesive layer 1910 on carrier substrate 1920. Accordingly, in the BS illumination type X-ray detector, the common electrode of photodiode layer 100-1 is the upper most layer of photodiode layer 100-1, and pixel driver micro IC 1200 is presented in the bottom most layer.

As shown in FIG. 5, metal contact lines and pixel driver micro IC do not block photodiodes 730 in accordance with at least one embodiment. Accordingly, the BS illustration type X-ray detector may deliver light photons to photodiode 730 without loss.

Furthermore, before flipping the resultant of driver layer 200-1 and photodiode layer 100-1, insulating substrate 710 may be removed using a laser lift off technology, and barrier layer 1820 and scintillator layer 1720 are formed on photodiode layer 100-2 using material having flexible property. Accordingly, the durability and the flexibility of X-ray detector may be improved.

Similar to the FS illumination type X-ray detector, photodiode layer 100-1 may be manufactured using a TFT process in accordance with at least one embodiment. Accordingly, photodiode layer 100-1 may be manufactured as a large surface X-ray detector with a comparatively low manufacturing price. Furthermore, such photodiode layer 100-1 may be manufactured as a continuous layer for a comparatively low manufacturing price. Alternatively, photodiode layer 100-1 may be formed in an island array structure by patterning the continuous photodiode layer. In this case, such a structure may minimize crosstalk between adjacent photodiodes.

Similar to the FS illumination type X-ray detector, driver layer 200-1 may include a plurality of pixel driving ICs 1200 each controlling at least two of photodiodes and metal contacts connecting pixel driving ICs to corresponding photodiodes 730. In an embodiment of the present disclosure, one pixel driving IC 1200 sequentially or simultaneously controls four photodiodes. However, the embodiments of the present disclosure are not limited thereto. The number of photodiodes controlled by one pixel driving IC 1200 may be vary according to various factors related to the X-ray detector.

In particular, a plurality of pixel driving ICs 1200 are manufactured separately from the photodiode layer 100 and printed on photodiode layer 100 using the micro-transfer printing technology after forming contact holes in photodiode layer 100. Then, metal contacts 140 are formed to connect pixel driving ICs 1200 to corresponding photodiodes 730. As described, the plurality of pixel driving ICs 1200 may be manufactured using a CMOS process and printed on photodiode layer 100 using the micro-transfer technology. Accordingly, pixel driving ICs 1200 may be manufactured with high precision (e.g., nanometer level) to have a high image quality.

Similar to the FS illumination type X-ray detector, photodiode layer 100-1 may include common electrode 720 formed on insulating substrate 710, a plurality of photodiodes 730 arranged on common electrode 720 in matrix, and top transparent pixel electrode 740. A plurality of photodiodes 730 may receive visible light photons and convert light photons into an electrical signal. Such photodiode 730 may have a PIN diode structure including a P+ type region (e.g., high-concentration P type), a I type region, and an N type region. For example, the P type photoconductive material may be CdTe.

Unlike the FS illumination type X-ray detector, scintillator layer 300-1 may be formed on photodiode layer 100-1. Such scintillator layer 300-1 may convert X-rays into visible light. Scintillator layer 300-1 may include scintillator 1720 and barrier layer 1820 and be made of material having flexible properties. Scintillator layer 300 may be formed of CsI or Gadox (Gd2O2:Tb).

Hereinafter, a method of manufacturing an X-ray detector according to the embodiments of the present disclosure will be described with reference to FIGS. 6 to 20.

Figure 6:
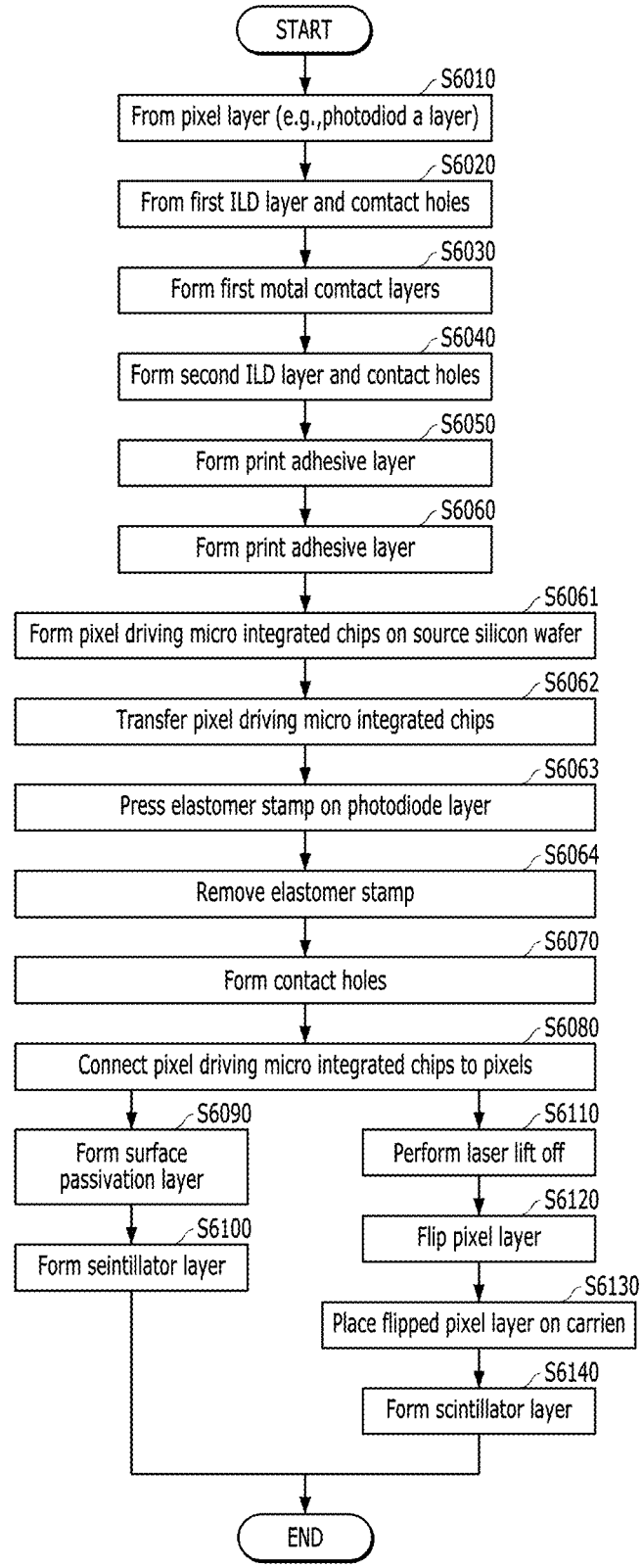
FIG. 6 is a flowchart illustrating a method of manufacturing an X-ray detector according to at least one embodiment of the present disclosure.
Figure 17:
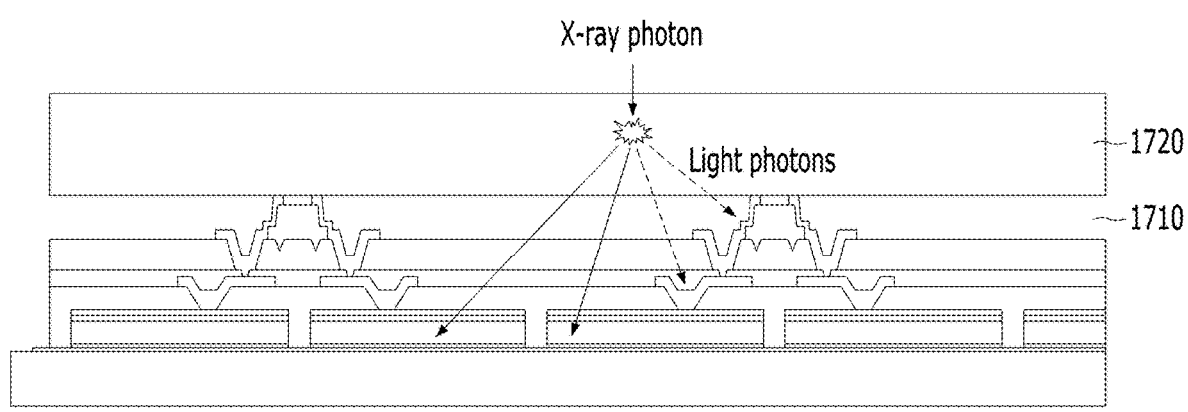
Figure 18:
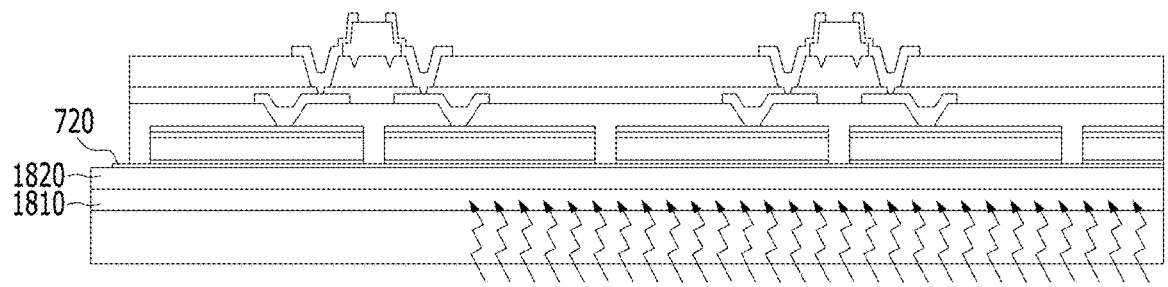
FIG. 18 to FIG. 20 are cross-sectional views for describing a method of manufacturing a back side illumination type X-ray detector in accordance with at least one embodiment.
Figure 19:
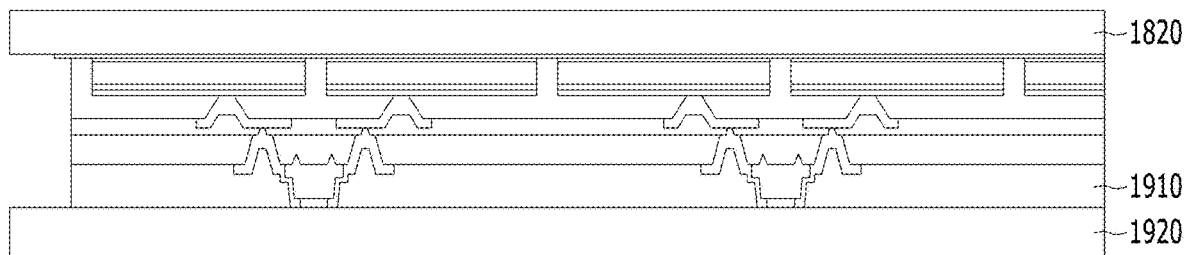
Figure 20:
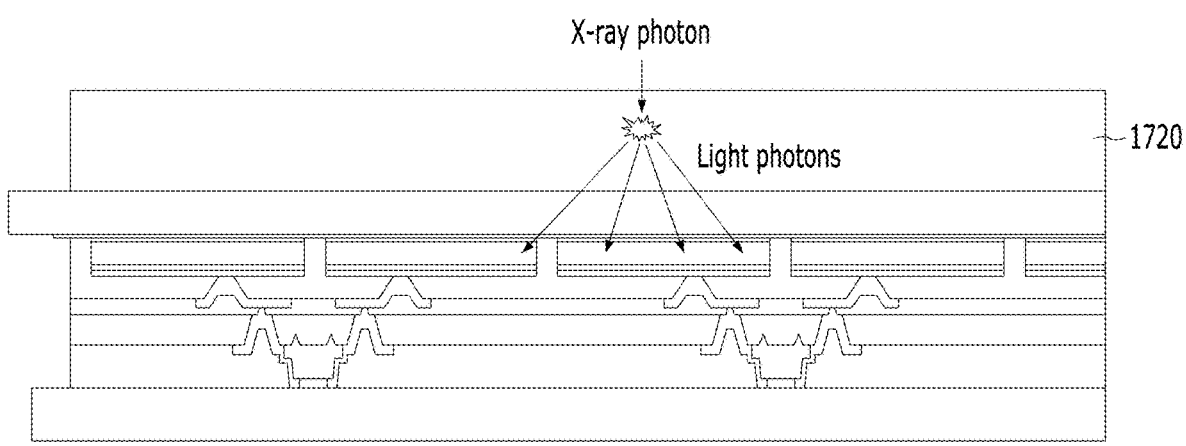

FIG. 6 is a flowchart illustrating a method of manufacturing an X-ray detector according to at least one embodiment of the present disclosure. FIGS. 7 to 17 are cross-sectional views for describing a method of manufacturing a front side illumination type X-ray detector in accordance with at least one embodiment. FIGS. 18 to 20 are cross-sectional views for describing a method of manufacturing a back side illumination type X-ray detector in accordance with at least one embodiment.

Referring to FIG. 6, photodiode layer 100 may be formed at step 6010. In particular, a plurality of photodiodes 730 may be formed on insulating substrate 710 at step S6010. In particular, FIG. 7 illustrates a process of forming a photodiode layer in accordance with at least one embodiment.

Figure 7:
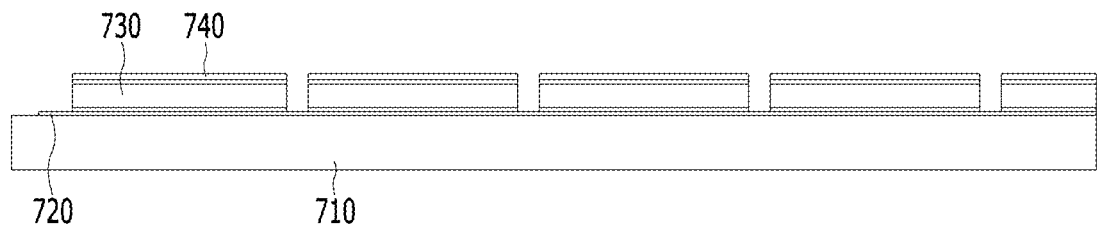
FIG. 7 to FIG. 17 are cross-sectional views for describing a method of manufacturing a front side illumination type X-ray detector in accordance with at least one embodiment.

As illustrated in FIG. 7, common bottom electrode 720 may be formed on insulating substrate 710. Insulating substrate 710 may be made of material having flexible property. Common bottom electrode 720 may be made of indium tin oxide (ITO) or indium zinc oxide (IZO). Common bottom electrode 720 may be an ITO glass substrate or an IZO glass substrate, but the embodiments of the present disclosure are not limited thereto. In particular, common bottom electrode 720 may be a transparent layer for a back side illumination type X-ray detector. However, common bottom electrode 720 may be not a transparent layer for a front side illumination type X-ray detector. On common bottom electrode 720, a plurality of photodiodes 730 are formed. Photodiodes 730 may be made of amorphous silicon (a-Si) or organic silicon. Photodiodes 730 may be formed by forming a i-Si layer on common bottom electrode 720, forming a p-Si layer on the i-Si layer, and forming an n-Si layer on the p-Si layer.

Top transparent pixel electrode 740 may be formed on photodiodes 730. Top transparent pixel electrode 740 may be made of indium tin oxide (ITO) or indium zinc oxide (IZO). Top transparent pixel electrode 740 may be an ITO glass substrate or an IZO glass substrate, but the embodiments of the present disclosure are not limited thereto. In particular, Top transparent pixel electrode 740 may be a transparent layer for a front side illumination type X-ray detector. However, Top transparent pixel electrode 740 may be not a transparent layer for a back side illumination type X-ray detector. As described, such photodiode layer 100 may be formed using the TFT process in accordance with at least one embodiment. Photodiode layer 100 may be formed as a continuous layer, thereby minimizing a unit manufacturing price. Furthermore, photodiode layer 100 may be formed in an Island array structure through patterning. That is, as shown, a plurality of photodiodes 730 is formed thereon in a form of matrix. In this case, the crosstalk between adjacent photodiodes may be minimized.

Referring back to FIG. 6, driver layer 200 may be formed on photodiode layer 100 at steps S6020 to S6050. In particular, FIG. 8 to FIG. 14 are diagrams illustrating a procedure of forming a driving layer on a photodiode layer in accordance with at least one embodiment.

Figure 8:
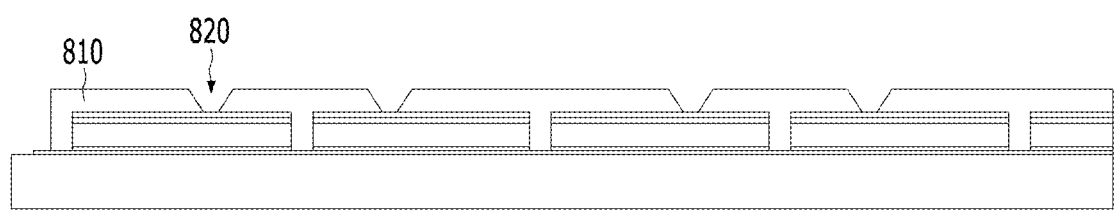

At step S6020, first inter layer dielectric (ILD) layer 810 (e.g., ILD1) may be formed on photodiode layer 100 to cover all photodiodes 730 and gaps between adjacent pixels, and a plurality of metal contact holes 820 may be formed in first ILD1 layer 810 as shown in FIG. 8. In particular, one metal contact hole 820 may be formed on each photodiode to expose top transparent pixel electrode 740.

Figure 9:
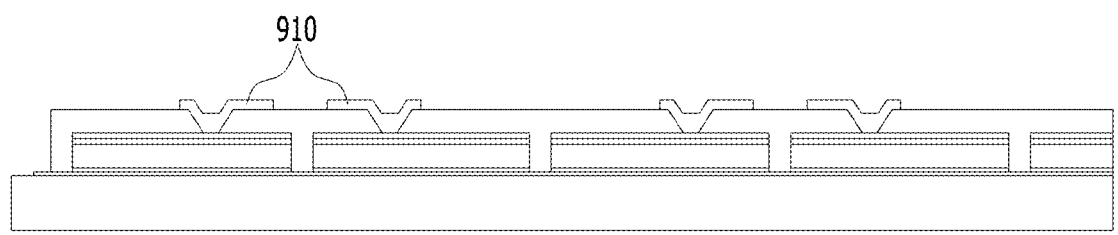

At step S6030, first metal contact layer 910 may be formed to fill first contact hole 820 and to extend along the top surface of ILD1 layer 810 in predetermined length, as shown in FIG. 9.

Figure 10:
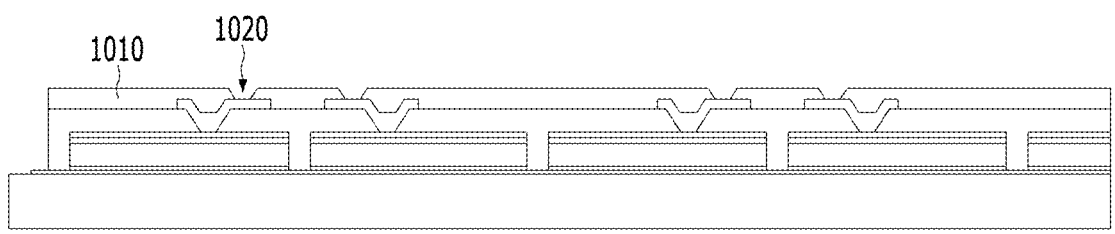

At step S6040, second ILD layer 1010 (ILD2) may be formed on metal contact layer 910 and first ILD layer 810 (ILD1), and second contact holes 1020 may be formed at each photodiode 730 in second ILD layer 1010 (ILD2) to expose corresponding first metal contact layer 910, as shown in FIG. 10.

Figure 11:
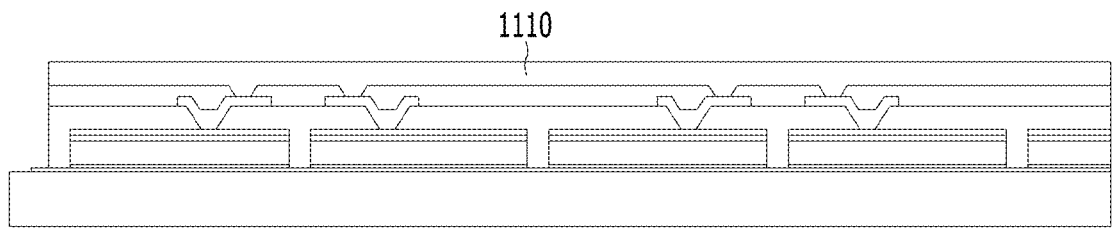

At step S6050, print adhesive layer 1110 may be formed on second ILD layer 1010 (ILD2) and second contact holes 1020, as shown in FIG. 11. Print adhesive layer 1101 may be made of resin and a thickness of about 1.2 um.

Print adhesive layer 1101 may be formed for printing pixel driving integrated chips (ICs) 1200 thereon. That is, print adhesive layer 1101 on photodiode layer 100 may be a target panel.

Figure 12:
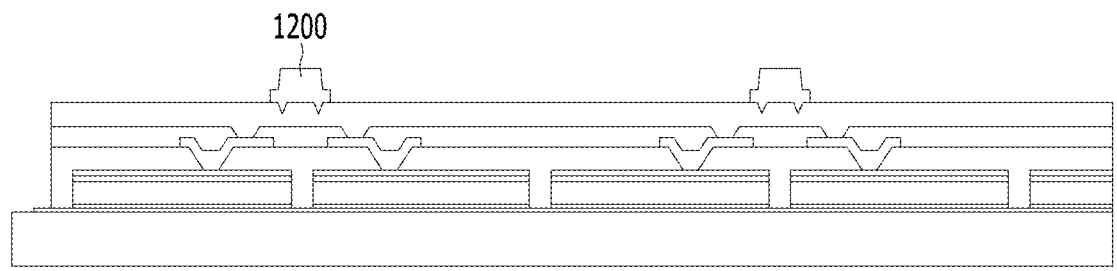

At step S6060, pixel driving integrated chips (ICs) 1200 may be printed on print adhesive layer 1100. Each pixel driving IC may be positioned between two adjacent pixels, as shown in FIG. 12. In particular, each pixel driving IC may be position to sequentially control corresponding four photodiodes in accordance with at least one embodiment.

Figure 21:
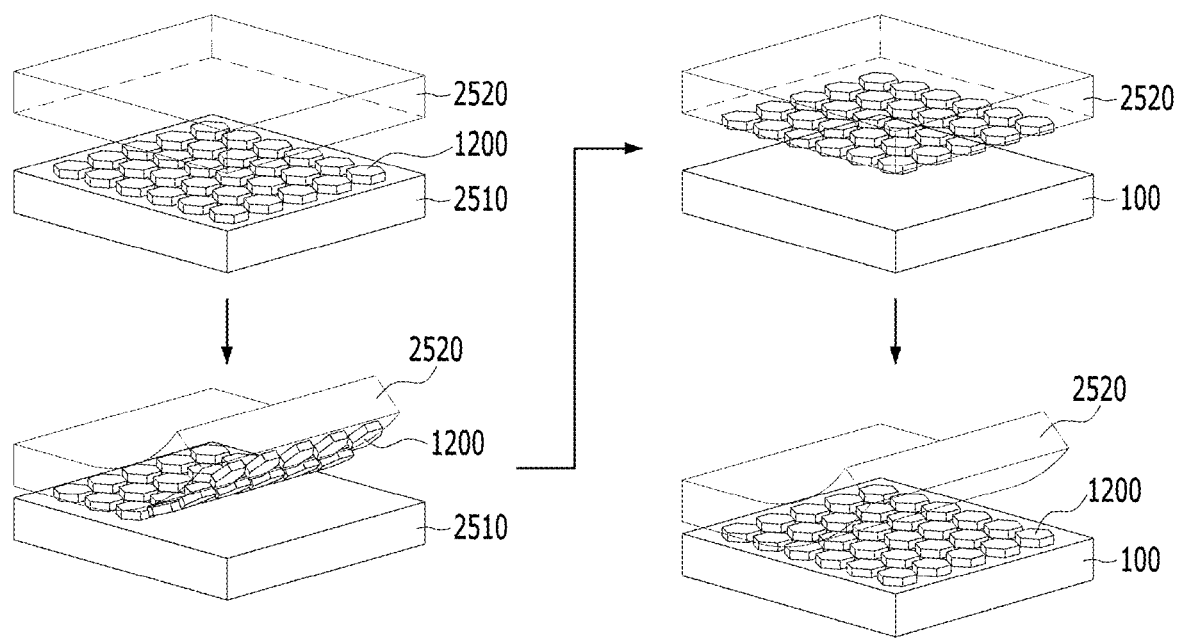
FIG. 21 is a view for describing printing a plurality of pixel driving micro integrated chips on a photodiode layer through a micro transfer printing technique in accordance with at least one embodiment.

Hereinafter, a micro transfer printing process will be described with reference to FIG. 6 and FIG. 21. FIG. 21 shows a micro transfer printing process for printing a plurality of pixel driving micro integrated chips on a photodiode layer in accordance with at least one embodiment.

Referring to FIG. 6 and FIG. 21, at step S6061, pixel driving integrated chips (ICs) 1200 may be fabricated in source silicon wafer 2510. A CMOS process may be performed in order to fabricate an IC with high precision (e.g., micrometer level) to provide a high image quality. Then, at step S6062, pixel driving integrated chips (ICs) 1200 on source silicon wafer 2510 may be transferred onto elastomer stamp 2520. At step S6063, pixel driving integrated chips 1200 may be printed on print adhesive layer 1101 on photodiode layer 100 by pressing elastomer stamp 2520 on target panel 2530 (e.g., print adhesive layer 1101 on photodiode layer 100) with predetermined conditions. At step S6064, elastomer stamp 2520 may be removed after printing.

Referring back to FIG. 12, for example, a height of each pixel driving IC may be shorter than about 10 um. Furthermore, a thickness from bottom common electrode 720 to print adhesive layer 1110 may be thinner than about 5um.

Figure 13:
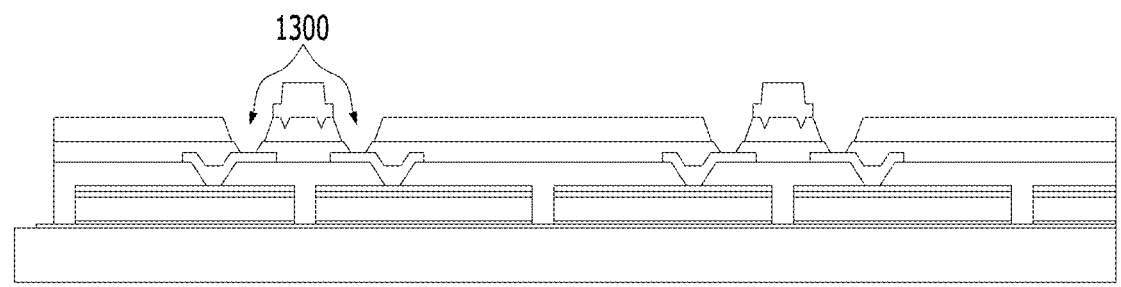

At step S6070, third contact holes 1300 may be formed at both sides of each pixel driving IC 1200 to expose first metal contact layer 910 through second ILD2 layer 1010 and print adhesive layer 1110, as shown in FIG. 13.

Figure 14:
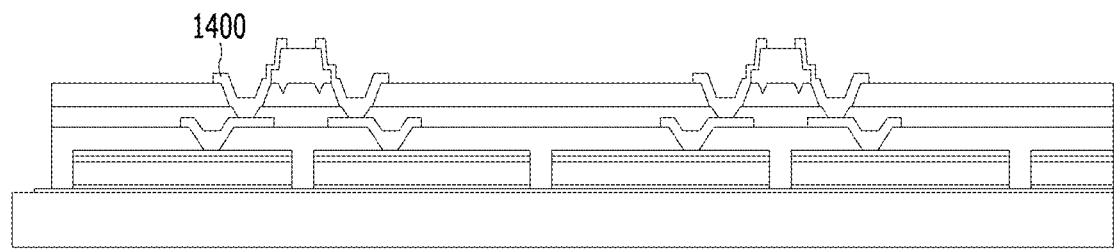

At step S6080, second metal contact layer 1400 may be formed to fill third contact holes 1300 and connect both ends of pixel driving IC 1200 in accordance with at least one embodiment, as shown in FIG. 14. Accordingly, each end of pixel driving IC 1200 may be connected to corresponding photodiode 730.

Figure 15:
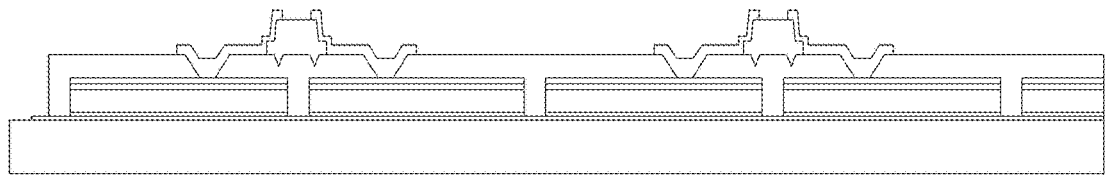

In accordance with another embodiment of the present disclosure, pixel driving IC 1200 may be formed directly on first ILD layer 810 and connected to corresponding photodiodes 720 without forming second ILD layer 1010 and print adhesive layer 1110 when first ILD layer 810 has moisture proofing priority and adhesive priority, as shown in FIG. 15. In this case, a manufacturing method may be further simplified.

Figure 16:
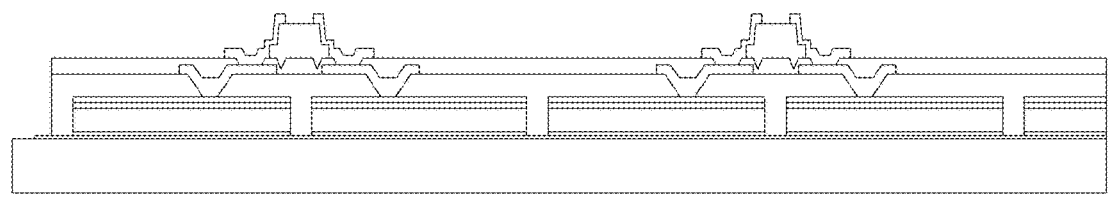

In accordance with still another embodiment of the present disclosure, pixel driving IC 1200 may be formed directly on second ILD 2 layer 1010 and connected to corresponding pixels 730 without forming print adhesive layer 1110 when second ILD 2 layer 1010 has moisture proofing priority and adhesive priority, as shown in FIG. 16.

Referring back to FIG. 6, surface passivation layer 1710 is formed on print adhesive layer 1110 and pixel driving ICs 1200 at step S6090. Scintillator layer 1720 may be formed on the surface passivation layer 1610 at step S6100, as shown in FIG. 17.

By forming scintillator layer 1720 on the pixel driving ICs 1200 and passivation layer 1610, pixel area 111 of front side illumination X-ray detector 10 may be completely manufactured. X-ray detector 10 may be manufactured as a back side illumination type X-ray detector in accordance with another embodiment. Hereinafter, a method for manufacturing a pixel area of the back side illumination type X-ray detector will be described with reference to FIG. 18 to FIG. 20.

FIG. 18 to FIG. 20 are cross-sectional views schematically illustrating a process of manufacturing a back side illumination type X-ray detector in accordance with at least one embodiment.

Referring back to FIG. 18, a sacrificing layer 1810 is formed on insulating substrate 710, and a barrier layer 1820 is formed on the sacrificing layer 1810 at step S6010. The sacrificing layer 1810 is formed for laser lift off (LLO). The barrier layer 1820 is made of PI. After forming the barrier layer 1820, photodiode layer 100 and driving layer 200 may be formed on the barrier layer 1820 similar to processes shown in FIG. 7 to FIG. 14.

After forming photodiode layer 100 and driving layer 200 at step S6080, a laser lift-off process may be performed for removing the glass layer 710 and the sacrificing layer 1810 at step S6110 as shown in FIG. 18. Since glass layer 710 is remove, the durability of X-ray detector 10 may be enhanced in accordance with at least one embodiment.

Referring to FIG. 19, after the laser lift-off process S6110, a flipping process is performed for flipping the resultant of photodiode layer 100 and driving layer 200 at step S6120 and placed on adhesive layer 1910 formed on carrier substrate 1920 made of a carbon graphite at step S6130.

Referring to FIG. 20, scintillator layer 1720 is formed on barrier layer 1820 at step S6130. By forming scintillator layer 1720 on barrier layer 1820, the pixel area of back side illumination type X-ray detector may be formed completely.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

The present invention can be embodied in the form of methods and apparatuses for practicing those methods. The present invention can also be embodied in the form of program code embodied in tangible media, non-transitory media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

No claim element herein is to be construed under the provisions of 35 U.S.C. § 112, sixth paragraph, unless the element is expressly recited using the phrase "means for" or "step for."

Although embodiments of the present invention have been described herein, it should be understood that the foregoing embodiments and advantages are merely examples and are not to be construed as limiting the present invention or the scope of the claims. Numerous other modifications and embodiments can be devised by those skilled in the art that will fall within the spirit and scope of the principles of this disclosure, and the present teaching can also be readily applied to other types of apparatuses. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An X-ray detector comprising:
a photodiode layer including a plurality of photodiodes and configured to receive visible light protons from a scintillator layer and convert the visible light protons to electric signals; and
a driver layer formed on the photodiode layer and including a plurality of pixel driving integrated chips each coupled to two or more photodiodes in the photodiode layer,
wherein the plurality of pixel driving integrated chips is formed on the photodiode layer,
wherein each one of the plurality of pixel driving integrated chips includes:
a timing generator configured to generate a timing signal to sequentially control the coupled photodiodes;
a plurality of switches each coupled to corresponding photodiode; and
a pixel driver transistor configured to sequentially turn on the plurality of switches according to the generated timing signal.

2. The X-ray detector of claim 1, wherein the plurality of pixel driving integrated chips is printed on the photodiode layer using a micro-transfer printing method.

3. The X-ray detector of claim 1, wherein each one of the plurality of pixel driving integrated chips is coupled to two or more photodiodes in the photodiode layer and controls the coupled photodiodes.

4. The X-ray detector of claim 3, wherein each one of the plurality of pixel driving integrated chips is coupled to four photodiodes.

5. The X-ray detector of claim 1, wherein: the photodiode layer is manufactured using a thin-film transistor (TFT) process; and the plurality of pixel driving integrated chips is manufactured on a source wafer using a complementary metal-oxide-semiconductor (CMOS) process, transferred onto an elastomer stamp, and printed on the photodiode layer using the elastomer stamp through the micro-transfer printing method.

6. The X-ray detector of claim 1, further comprising: a scintillator layer formed on the driver layer as a front side illumination type X-ray detector and configured to convert X-ray to visible light photons.

7. The X-ray detector of claim 1, further comprising: a scintillator layer formed on the photodiode layer as a back side illumination type X-ray detector and configured to convert X-ray to visible light photons.

8. The X-ray detector of claim 1, wherein each one of the plurality of pixel driving integrated chips is formed on the photodiode layer to form a three-dimension structure with corresponding metal contacts and a corresponding common bottom layer of a corresponding photodiode.

9. The X-ray detector of claim 1, wherein an adhesive layer made of predetermined resin is formed on the photodiode layer for printing the plurality of micro driving integrated chips thereon.

10. The X-ray detector of claim 1, wherein the plurality of micro driving integrated chips is fabricated on a source silicon wafer, the plurality of fabricated micro driving integrated chips is transferred onto an elastomer stamp, and the plurality of fabricated micro driving integrated chips is printed on the photodiode layer by stamping the elastomer stamp on the photodiode layer.

11. A method for manufacturing an X-ray detector, comprising:
forming a photodiode layer on an insulating substrate, wherein the photodiode layer includes a plurality of photodiodes and configured to receive visible light protons from a scintillator layer and convert the visible light protons to electric signals;
forming a driver layer on the photodiode layer by attaching a plurality of micro driving integrated chips on the photodiode layer;
forming contact holes through the driver layer and the photodiode layer; and
forming metal contact layers by filling the contact holes for coupling one micro driving integrated chip to two or more photodiodes in the photodiode layer.

12. The method of claim 11, wherein the forming a driving layer comprises: printing the plurality of micro driving integrated chips on the photodiode layer using a micro-transfer printing method.

13. The method of claim 12, the printing comprises:
fabricating the plurality of micro driving integrated chips on a source silicon wafer;
transferring the plurality of fabricated micro driving integrated chips onto an elastomer stamp; and
printing the plurality of fabricated micro driving integrated chips on the photodiode layer by stamping the elastomer stamp on the photodiode layer.

14. The method of claim 12, wherein: the fabricating the plurality of micro driving integrated chips comprise performing a complementary metal oxide semiconductor (CMOS) process to fabricate the plurality of micro driving integrated chips on the source wafer; and the forming a photodiode layer comprises performing a thin-film transistor (TFT) process to fabricate the photodiode layer.

15. The method of claim 12, wherein in the printing a plurality of micro driving integrated chips on the photodiode layer, each one of the plurality of pixel driving integrated chips is placed to form a three dimensional structure with corresponding metal contacts and a corresponding common bottom layer of a corresponding photodiode.

16. The method of claim 11, further comprising:

forming an adhesive layer on the photodiode layer for printing the plurality of micro driving integrated chips on the photodiode layer, wherein the plurality of micro driving integrated chips is transferred onto an elastomer stamp, and the plurality of transferred micro driving integrated chips on the elastomer stamp is printed on the photodiode layer.

17. The method of claim 11, wherein the forming metal contact layers comprises:

forming the metal contact layers for coupling each one of the plurality of micro driving integrated chips to corresponding four adjacent photodiodes in the photodiode layer, wherein the each one micro driving integrated chip is configured to sequentially or simultaneously control the coupled four adjacent photodiodes.

18. The method of claim 11, further comprising: forming a scintillator layer formed on the driver layer as a front side illumination type X-ray detector.

19. The method of claim 11, further comprising: removing the insulating substrate of the photodiode layer using a laser lift off technique; flipping the driver layer and the photodiode layer and placed the flipped resultant on an adhesive layer formed on a carrier substrate;

forming a scintillator layer formed on a bottom common electrode layer of the photodiode layer as a back side illumination type X-ray detector.

* * * * *